(12) United States Patent
Wicpalek et al.

(10) Patent No.: US 9,584,139 B2
(45) Date of Patent: Feb. 28, 2017

(54) PHASE TRACKER FOR A PHASE LOCKED LOOP

(71) Applicant: Intel IP Corporation, Santa Clara, CA (US)

(72) Inventors: Christian Wicpalek, Puchenau (AT); Thomas Mayer, Linz (AT); Andreas Mayer, Gramastetten (AT); Thorsten Tracht, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/494,718

(22) Filed: Sep. 24, 2014

(65) Prior Publication Data

US 2016/0087639 A1    Mar. 24, 2016

(51) Int. Cl.
*H03L 7/08* (2006.01)
*H03L 7/085* (2006.01)
(Continued)

(52) U.S. Cl.
CPC ............ *H03L 7/085* (2013.01); *G04F 10/005* (2013.01); *H03L 7/1976* (2013.01)

(58) Field of Classification Search
CPC .. H04B 7/0413; H04B 7/0452; H04B 7/0671; H03L 7/00; H03L 7/06;
(Continued)

(56) References Cited

U.S. PATENT DOCUMENTS 6,014,177 A * 1/2000 Nozawa ................. H04N 5/126
327/156
8,433,027 B2 * 4/2013 Hammond ................ H03L 7/07
327/156
(Continued)

FOREIGN PATENT DOCUMENTS

JP    S58171131 A    10/1983
JP    S60160220 A    8/1985

OTHER PUBLICATIONS

Liu, Yuyu et al. "A Novel Clock and Data Recovery Scheme Based on Sigma-Delta Quantization." IEEE, 2005. pp. 475-478.
(Continued)

*Primary Examiner* — John Poos
(74) *Attorney, Agent, or Firm* — Eschweiler & Potashnik, LLC

(57) ABSTRACT

A phase locked loop includes a feedforward path receiving a reference signal having a reference frequency and outputting an output signal having an output frequency that is a function of the reference signal and a feedback signal. The phase locked loop further includes a feedback path having a divider circuit associated therewith that is configured to receive the output signal and generate the feedback signal having a reduced frequency based on a divide value of the divider circuit. The feedback signal is supplied to the feedforward path. The phase locked loop also includes a modulator circuit configured to receive modulation data and provide a divider control signal to the divider circuit to control the divide value thereof, and a phase tracker circuit
(Continued)

configured to determine an amount of phase drift from an initial phase value of the output signal due to an interruption in a locked state of the phase locked loop.

17 Claims, 6 Drawing Sheets

(51) Int. Cl.
*G04F 10/00* (2006.01)
*H03L 7/197* (2006.01)

(58) Field of Classification Search
CPC . H03L 7/07; H03L 7/08; H03L 7/0807; H03L 7/0802; H03L 7/0814; H03L 7/093
USPC ................................ 327/147, 156, 158, 161
See application file for complete search history.

(56) References Cited

U.S. PATENT DOCUMENTS

| | | |
|---|---|---|
| 2006/0067454 A1 | 3/2006 | Camuffo |
| 2006/0093019 A1 | 5/2006 | Gaikwad et al. |
| 2011/0007839 A1 | 1/2011 | Tang et al. |
| 2013/0223564 A1* | 8/2013 | Mayer ................. H04L 27/2032 375/296 |

OTHER PUBLICATIONS

European Search Report, Dated Feb. 19, 2016, Application No. 15181478.7-1805.

* cited by examiner

PHASE TRACKER FOR A PHASE LOCKED LOOP

BACKGROUND

Communication devices such as laptop computers, tablet computers, smart phones and personal digital assistants (PDAs) often employ phase locked loops in the modulation of data onto a carrier signal for subsequent transmission. An output phase thereof is typically known, and this known output phase is sometimes employed by other circuits in the communication device.

DETAILED DESCRIPTION

Figure 2:
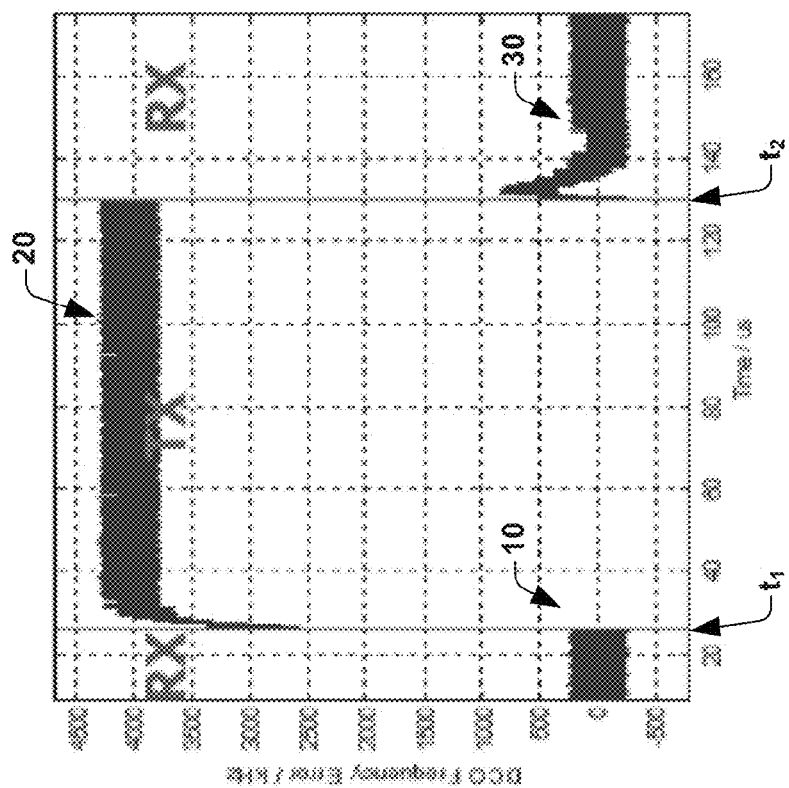
FIG. 2 is a graph illustrating a frequency error cause by a change in channel frequency in a phase locked loop when transitioning between a receive mode and a transmit mode when a phase locked loop is a shared circuit in a time division duplexer (TDD) architecture.

The systems and methods of this disclosure are described with reference to the attached drawing figures, wherein like reference numerals are used to refer to like elements throughout, and wherein the illustrated structures and devices are not necessarily drawn to scale.

A device and method are disclosed that are directed to a phase locked loop having a phase tracker circuit associated therewith.

A phase locked loop is a common circuit employed in many different applicants. For example, in communications applications, phase locked loop circuits are used to generate local oscillator (LO) signals for use in up-converters in transmitter circuits and down-converters in receiver circuits. Phase locked loop circuits are also often used in modulator circuits for phase and/or frequency modulation.

In general, a phase locked loop circuit operates to maintain a predetermined phase difference between an output phase (i.e., an oscillator phase) and a reference phase. In a type 2 phase locked loop, which is a common phase locked loop circuit implementation, the predetermined phase difference between a divided down oscillator phase and a reference phase is zero. If the phase locked loop is interrupted, for example, by programming the phase locked loop to a different channel frequency or a phase modulation, the phase of the output oscillator signal of the phase locked loop drifts away from the known phase value established by the reference phase. Therefore the absolute phase of the phase locked loop is no longer known after an interruption by other circuits which may expect a non-interrupted constant output frequency of the phase locked loop circuit.

The loss of knowledge of the exact phase can be a problem with other circuits that use knowledge of the phase in its operation. In one non-limiting example, a spur cancellation circuit employs knowledge of the phase in operation. Some types of spur cancellation circuitry reduce spurs (also called interference signals) by determining a cancelling tone and adding the cancelling tone to a baseband signal in the digital domain that results in a spur reduction in the transmit signal. Determining the cancelling tone may include selecting a frequency and/or a phase thereof. Determining the proper cancelling tone often requires knowledge of the phase of the oscillation signal output from the phase locked loop. Thus an interruption in the phase locked loop that causes a phase drift in the output (oscillator) signal thus causes a degradation in the performance of other circuits such as the spur cancellation circuit. Conventionally, a spur cancellation circuit undergoes a recalibration procedure upon detection of an interruption, however, such a recalibration to ascertain the new phase (i.e., the spur phase) may take several hundred microseconds, which severely degrades performance of the communication device.

A phase locked loop circuit may experience an interruption due to various circumstances. One circumstance that might lead to an interruption is when a phase locked loop is employed within a receiver circuit and experiences a change in channel frequency. For example, the receiver may regularly change receive channels in accordance with a predetermined channel hopping scheme. Alternatively, a receiver may receive an instruction to change channels in response to channel quality data that indicates a present channel has insufficient quality (e.g., a signal-to-noise ratio (SNR) below a predetermined level). In any event, even if subsequently the receiver switches back to the original channel relatively quickly (e.g., RX(f1)->RX(f2)->RX(f1), an interruption causes a phase drift. A phase drift is a movement of a phase value of the output signal of a phase locked loop circuit away from a previously known phase value, for example, when the phase locked loop circuit was in a previously locked state.

Figure 1:
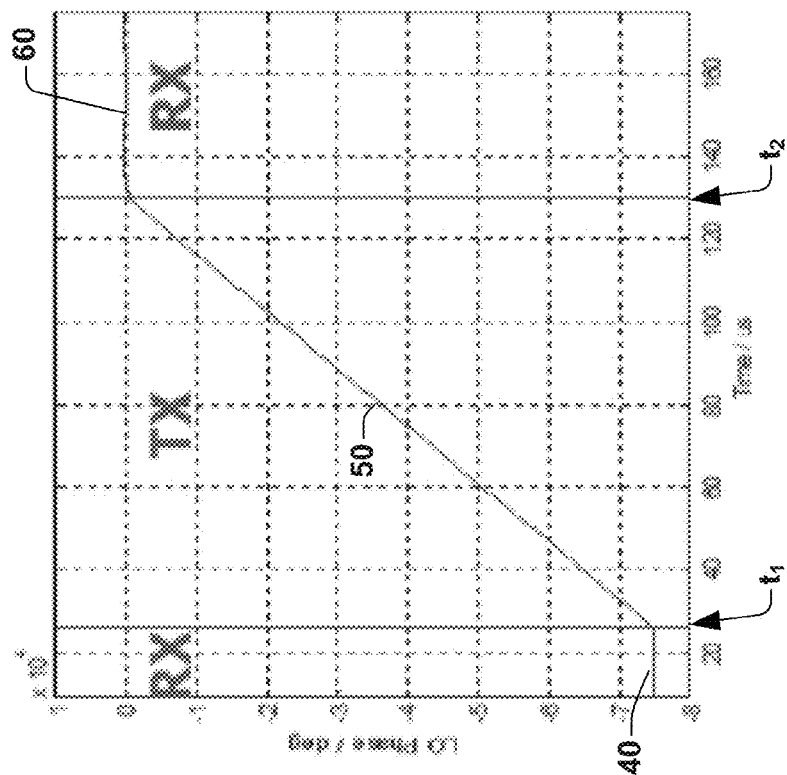
FIG. 1 is a graph illustrating a phase drift associated with an interruption in a phase locked loop circuit.

In another example, phase locked loop circuits are sometimes employed in time division duplex (TDD) architectures in which a transceiver has both receiver circuitry and transmitter circuitry that shares an antenna port by switching back and forth in accordance with predetermined time slots. In such instances, while the receiver circuitry and the transmitter circuitry operate on the same channel, the frequency of such circuits is not exactly the same. For example, referring to FIGS. 1 and 2, such figures illustrate how a phase drift in a phase locked loop can correspond to an interruption thereof. As illustrated in FIG. 2, a TDD architecture results in a receiver circuitry (RX) operating at a receive frequency 10 (illustrated as 0 frequency error) and then switching over to the transmit frequency at time $t_1$=25 microseconds, wherein the transmit frequency 20 is about 4 kHz greater than the receiver operating frequency. The transmitter operates at such frequency until time $t_2$=130 microseconds, at which time the receiver again begins operating at its original receive frequency at 30. As can be seen in FIG. 1 that illustrates a phase drift that corresponds to the frequency change from RX to TX and back to RX, prior to $t_1$ a known phase 40 of about −7.5 exists, which is stable. Upon the interruption caused by the switch over to transmit, the phase 50 between $t_1$ and $t_2$ drifts away from the previously known phase value to an unknown phase value. Upon the change back to receive mode, the phase 60 of the phase locked loop again stabilizes at 0.

As can be seen in FIG. 1, the absolute amount of phase drift depends upon the frequency offset between the receive and transmit modes, as well as the duration of the transmit mode. Because both of these factors are not known prior to design, as estimate of the phase drift experience by the phase locked loop problematic.

In another example, if the phase locked loop is being employed in a polar transmitter in a TDD type architecture, the phase locked loop is generating the phase modulated transmit signal. Thus when being shared by the receiver circuitry, the phase information gets lost. So in such a situation the receiver circuitry uses the phase locked loop with no modulation, then the transmitter circuitry uses the phase locked loop with polar modulation, and then the receiver circuitry again uses the phase locked loop without modulation. Thus in such a TDD based polar modulator transmitter scheme when the phase locked loop circuit is being shared by both the receive and transmit chains to reduce power consumption the modulated phase results in a rising phase, but the rate of change in not constant and thus the phase is gain unknown.

The present disclosure does not attempt to prevent interruptions or to prevent phase drift due to interruptions in a phase locked loop. Rather, the disclosure provides for a tracking circuit and method that operates to track the phase drift in real time and make the tracked phase drift available to other circuitry such as a spur cancellation circuit for use thereof, thereby avoiding time consuming and performance degrading recalibration procedures due to phase locked loop interruptions. While a spur cancellation circuit is highlighted as one example, it should be appreciated that other circuits may employ such information. For example, a digital signal processor algorithm may exploit this phase information for multiple different functions. Any subsequent use of the phase drift information may be utilized and all such implementations are contemplated as falling with the scope of the present disclosure.

Figure 3:
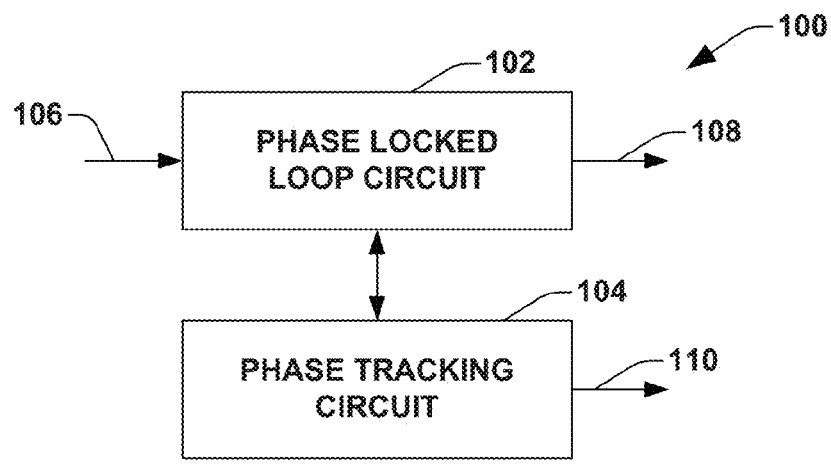
FIG. 3 is a block diagram illustrating a phase locked loop having a phase tracker in accordance with one embodiment of the disclosure.

Turning now to FIG. 3, a phase locked loop 100 is provided that includes a phase locked loop circuit 102 and a phase tracking circuit 104. The phase locked loop circuit 102 receives a reference signal 106 having a reference frequency and outputs an output signal 108 (also referred to as an oscillator signal) that is based on the reference frequency and a current channel word. The phase tracking circuit 104 is configured to determine a phase drift 110 based on a previous channel word and the current channel word of the phase locked loop circuit 102 (which may evidence an interruption thereof).

Figure 4:
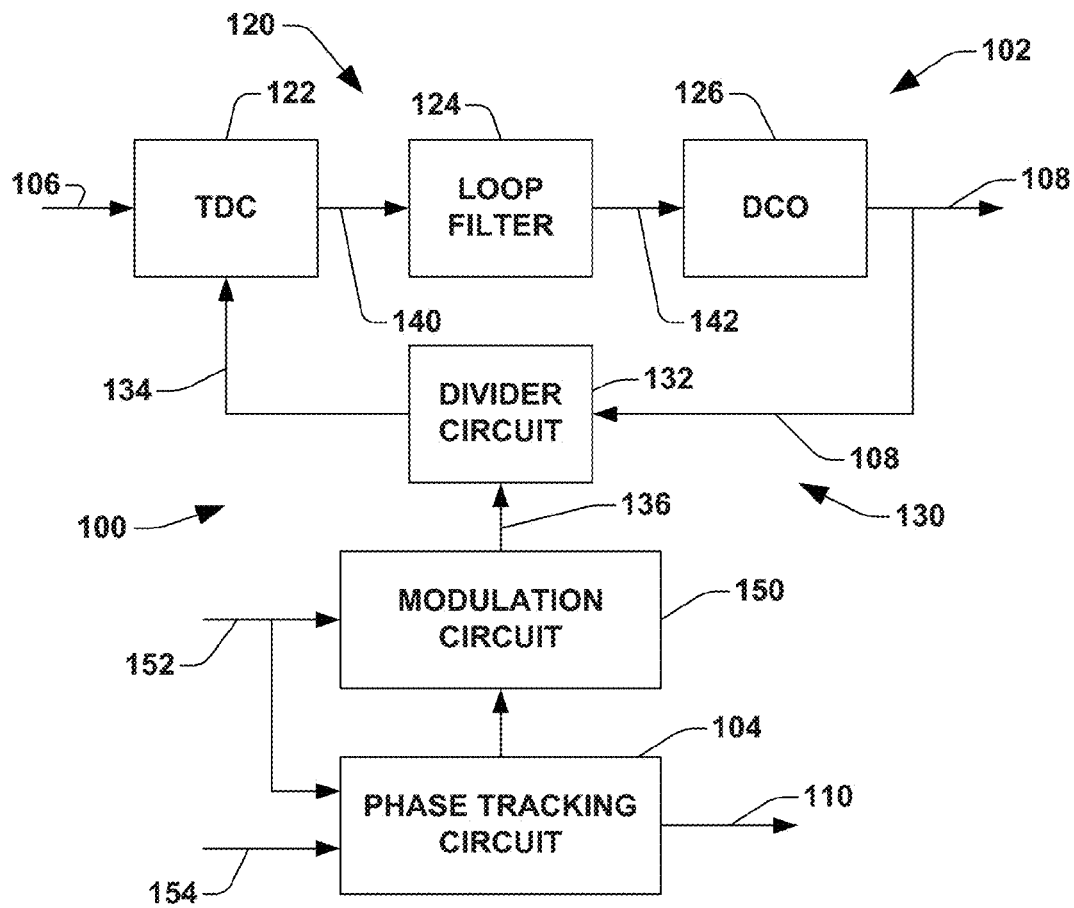
FIG. 4 is a block diagram illustrating a phase locked loop and modulation circuit having a phase tracker in accordance with another embodiment of the disclosure.

Another embodiment of the disclosure is illustrated in FIG. 4. The phase locked loop circuit 102 in one embodiment comprises a feedforward path 120 that receives the reference signal 106 having a reference frequency and outputs the output signal 108 having an output frequency. In one embodiment the feedforward path 120 comprises a time-to-digital converter (TDC) 122, a loop filter 124 and a digitally controlled oscillator (DCO) 126. The phase locked loop circuit 102 also comprises a feedback path 130 that includes a divider circuit 132. The divider circuit 132 receives the output (oscillator) signal 108 and generates a feedback signal 134 based thereon that comprises a divided down version of the output signal 108. The divider value (N) varies based on a divider control signal 136, which will be discussed in greater detail infra.

Referring again to the feedforward path 120 of the phase locked loop circuit 102, the TDC 122 receives both the reference signal 106 and the feedback signal 134 and calculates a time difference between the respective phase of the received signals 106 and 134. The calculated time difference is output as a digital error value 140 and provided to the loop filter 124. The loop filter 124 receives the error signal 140 and outputs an oscillator control signal 142 in response thereto which controls an output frequency (i.e., the output signal 108) of the controllable oscillator 126. More particularly, the control signal 142 output by the loop filter 124 results in a change in the output frequency of the output signal 108 such that a predetermined phase relationship is established and maintained between the reference signal 106 and the feedback signal 134. In one embodiment the desired phase relationship is identical phases, wherein the loop filter 124 alters the control signal 142 to minimize the error signal 140.

As highlighted above, the divide factor (N) of the divider circuit 132 is controlled via the divider control signal 136 that is output by a modulation circuit 150. The modulation circuit 150 receives modulation data and an intermediate (or new) channel word that in combination form a frequency control word 152 that operates to dictate changes in the divider control signal 136 that reflect a desired modulation of the output signal 108 of the phase locked loop circuit 102.

Still referring to FIG. 4, the phase locked loop 100 further comprises the phase tracking circuit 104. The phase tracking circuit 104 receives the frequency control word 152 and a previous channel word 154, and based on the two input words 152 and 154 calculates an amount of phase drift 110 due to an interruption in the phase locked loop circuit 102.

Figure 5:
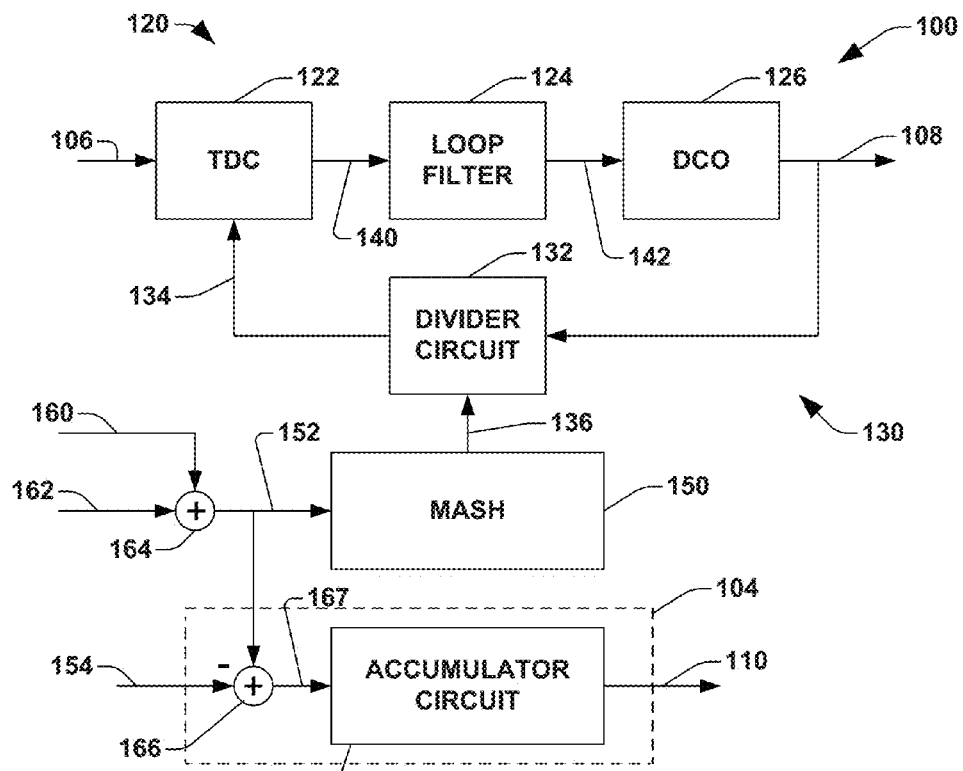
FIG. 5 is a block diagram illustrating a phase locked loop having a phase tracker incorporating an accumulator circuit in accordance with another embodiment of the disclosure.

FIG. 5 is another block diagram illustrating a phase locked loop circuit 102 having a phase tracking circuit 104 in accordance with another embodiment of the disclosure. The phase locked loop 100 has a phase locked loop circuit 102 similar to that illustrated in FIG. 4, wherein a feedforward path 120 and a feedback path 130 operate to generate an output oscillator signal 108. The divider circuit 132 divides down the output signal 108 based on a divider control signal 136 provided by a MASH type modulator circuit 150. In one embodiment a MASH type modulator 150 is a variation of the general type delta-sigma modulator, commonly called a multi-stage noise shaping (MASH) structure that includes a noise shaping property. Such a structure is often used in fractional-N phase locked loops, wherein the divide value N may comprise a fractional value. In one example, the MAH modulator comprises two more cascaded accumulator circuits, each of which is equivalent to a first-order sigma delta modulator. However, other type modulator circuits may be employed and all such variations are contemplated as falling within the scope of the present disclosure. In addition, on one embodiment, the divider circuit 132 may comprise a programmable multi-modulus divider (MMD), however, any type of divider circuit may be utilized.

Still referring to FIG. 5, modulation data 160 and an intermediate (or new) channel word 162 are combined at first computation circuit (e.g., an adder) 164 to form the frequency control word 152 that forms the input sequence to the MASH modulator 150. The frequency control word 152 is also input to a second computation circuit 166, wherein a difference 167 is computed between the frequency control word 152 and a previous control word 154 that represents the previous channel frequency. Therefore the frequency control word 152 contains information regarding the new channel frequency and the previous control word 154 contains information regarding the previous or old channel frequency. The resulting difference 167 represents a slope of the phase drift in the output signal 108. The difference signal 167 is input into an accumulator circuit 168, wherein the accumulation of the difference signal 167 over a time period represents the amount of phase drift through that time period (i.e., signal 110).

As previously discussed in conjunction with FIGS. 1 and 2, the amount of phase drift of the phase locked loop circuit will be a function both of the frequency offset and the duration of the offset. As seen in FIG. 5, the frequency control word 152 contains information regarding the new channel frequency and the signal 154 contains information regarding the previous or old channel frequency. Thus the difference signal 167 contains information relating to the size of the frequency offset between the old channel frequency and the new channel frequency. Further, by accumulating the difference over the entire time period of the interruption, the resultant signal 110 contains information that reflects both the frequency offset as well as the duration of the frequency offset.

Figure 6:
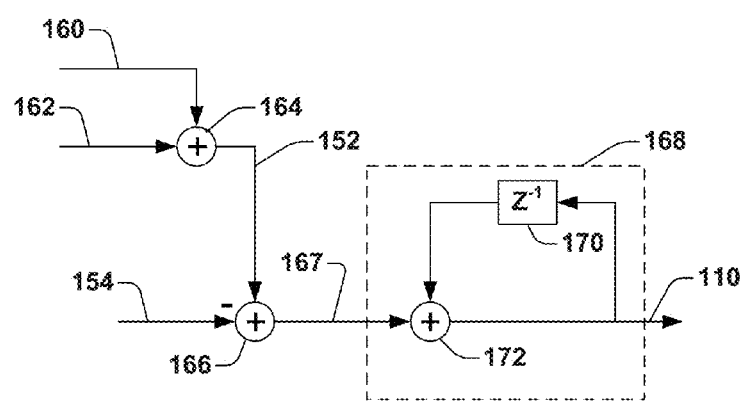
FIG. 6 is a circuit diagram illustrating an accumulator circuit according to one embodiment of the disclosure.

FIG. 6 is a block diagram illustrating one example embodiment of an accumulator 168. As illustrated, the different signal 167 is input to a third computation circuit 172 that combines the difference signal 167 with a delayed version of the output signal 110 delayed through a delay unit 170 in a feedback path. Thus the output signal 110 constitutes an accumulated signal that recursively adds the next amount of phase drift to a previous accumulated amount, thus continuously adding each of the elements of drift over a time period of the interruption to arrive at an accumulated value that represents the amount of phase drift 110 due to the interruption. The calculated phase drift 110 may then be used by other circuits that use knowledge of the phase of the phase locked loop circuit 102 in their respective functions. For example, as discussed previously, spur cancellation circuit uses knowledge of the phase in generating a calling tone. Since the amount of phase drift 110 has been calculated in real time, the phase drift signal 110 can be supplied as an input thereto and the spur cancellation circuit then has real time knowledge of the exact phase of the phase locked loop. Thus no time-consuming calibration procedure is necessary since the actual phase is known in real time due to the phase tracking circuit.

Figure 8:
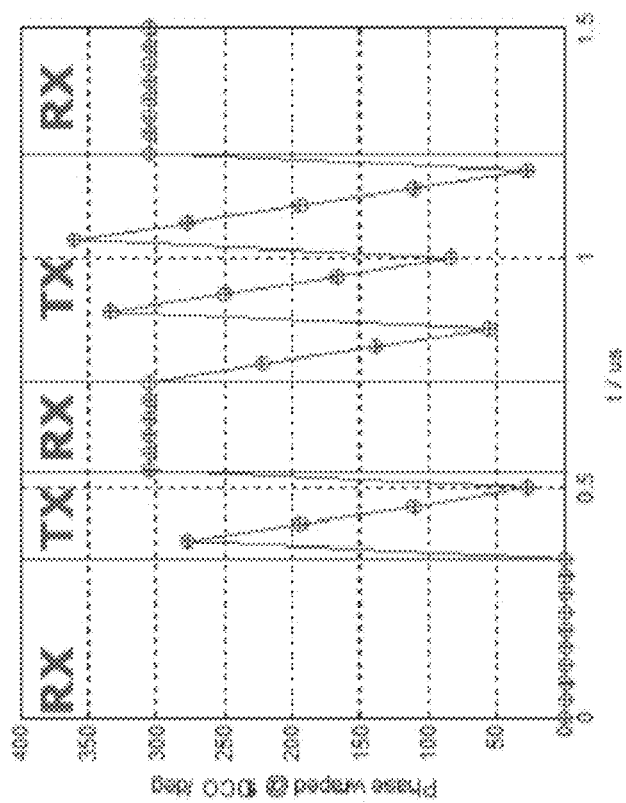
FIG. 8 is a graph illustrating the impact on the phase along several changes in channel frequency in a phase locked loop when transitioning between a receive mode and a transmit mode when a phase locked loop is a shared circuit in a time division duplexer (TDD) architecture.
Figure 7:
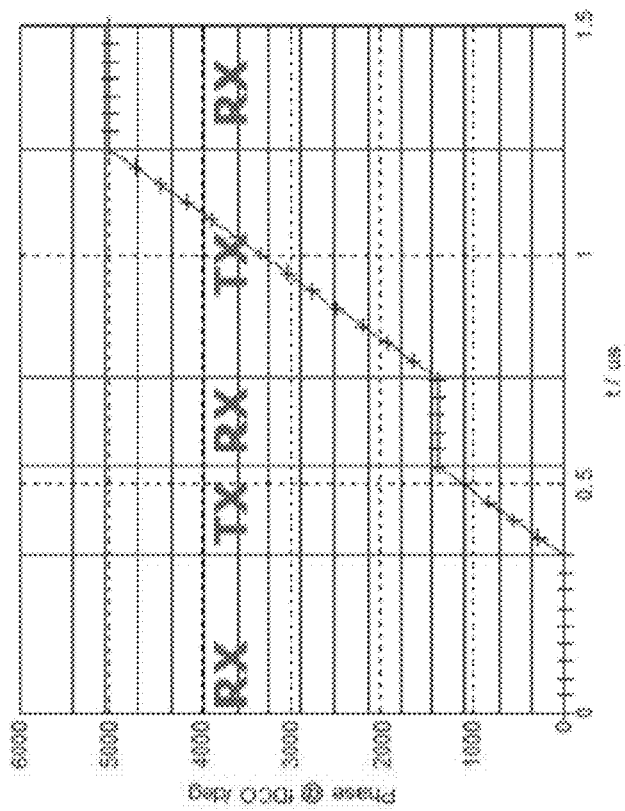
FIG. 7 is graph illustrating a phase drift associated with several interruptions in a phase locked loop circuit.

The phase characteristic will continue to drift over time due to repeating interruptions. One further example of a varying phase characteristic is illustrated in FIGS. 7 and 8. As can be appreciated, the accumulated phase can also become very high, which may require an accumulator such as the accumulator circuitry 168 of FIGS. 5 and 6 to have a high bit width. While the present disclosure contemplates such an accumulator in one embodiment, a high bit width results in circuitry having a large amount of area and a large current consumption, which may be disadvantageous in some applications.

Figure 9:
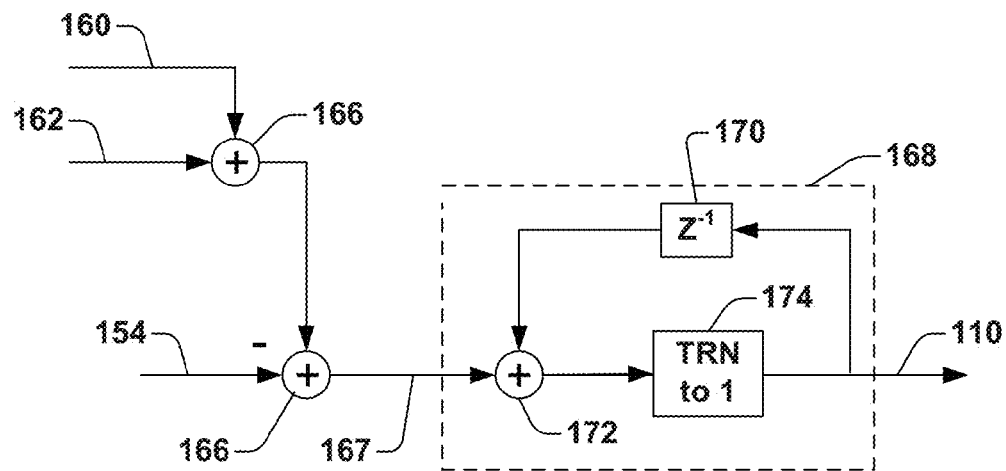
FIG. 9 is a circuit diagram illustrating an accumulator circuit with a wraparound feature according to another embodiment of the disclosure.

For many applications it is sufficient to do a wraparound when the phase drift reaches 360 degrees. For the frequency channel word (e.g., defined by the output signal frequency divided by the reference frequency), this is equivalent to a wraparound at 1. In one embodiment of the disclosure, such a wraparound is illustrated in the accumulator circuit 168 of FIG. 9. As shown in FIG. 9, the difference value 167 is provided to the third computation circuit 172. The summation result in input to a truncation element 174 that operates to remove or otherwise ignore the integer portion so that only the fractional part of the channel word difference 167 is accumulated. In the above manner, an accumulator circuit 168 having a wraparound feature may be employed that does not require as significant a bit width.

Figure 10:
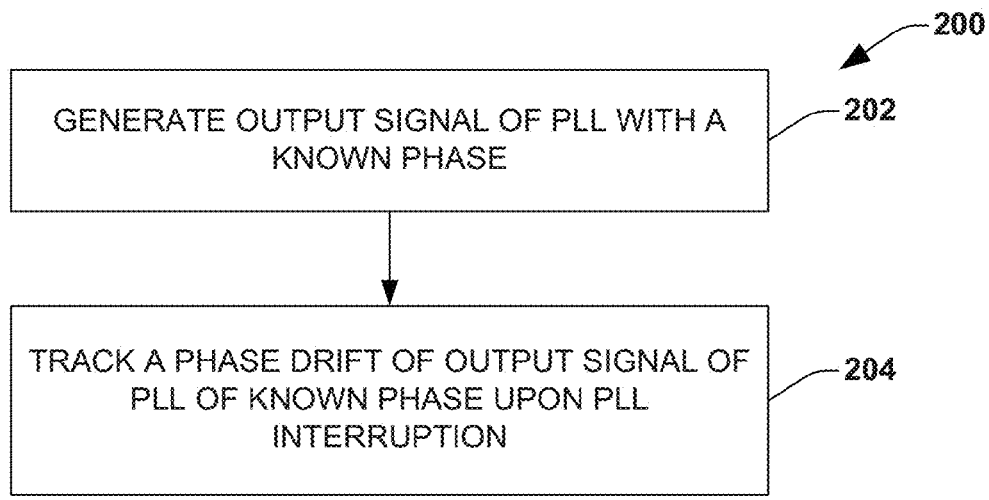
FIG. 10 is a flow chart illustrating a method of operating a phase locked loop that tracks a phase drift in an output frequency thereof according to one embodiment of the disclosure.

FIG. 10 is a flow chart illustrating a method 200 of operating a phase locked loop. The method 200 comprises generating an output signal of the phase locked loop (e.g., phase locked loop circuit 102 of FIGS. 3-5) at 202, wherein the output signal has a known phase. The method 200 continues at 204 by tracking a phase drift of the output signal of the phase locked loop from the known phase due to an interruption of the phase locked loop. According to one embodiment the interruption comprises a change in a channel frequency or a phase modulation of the output signal.

Figure 11:
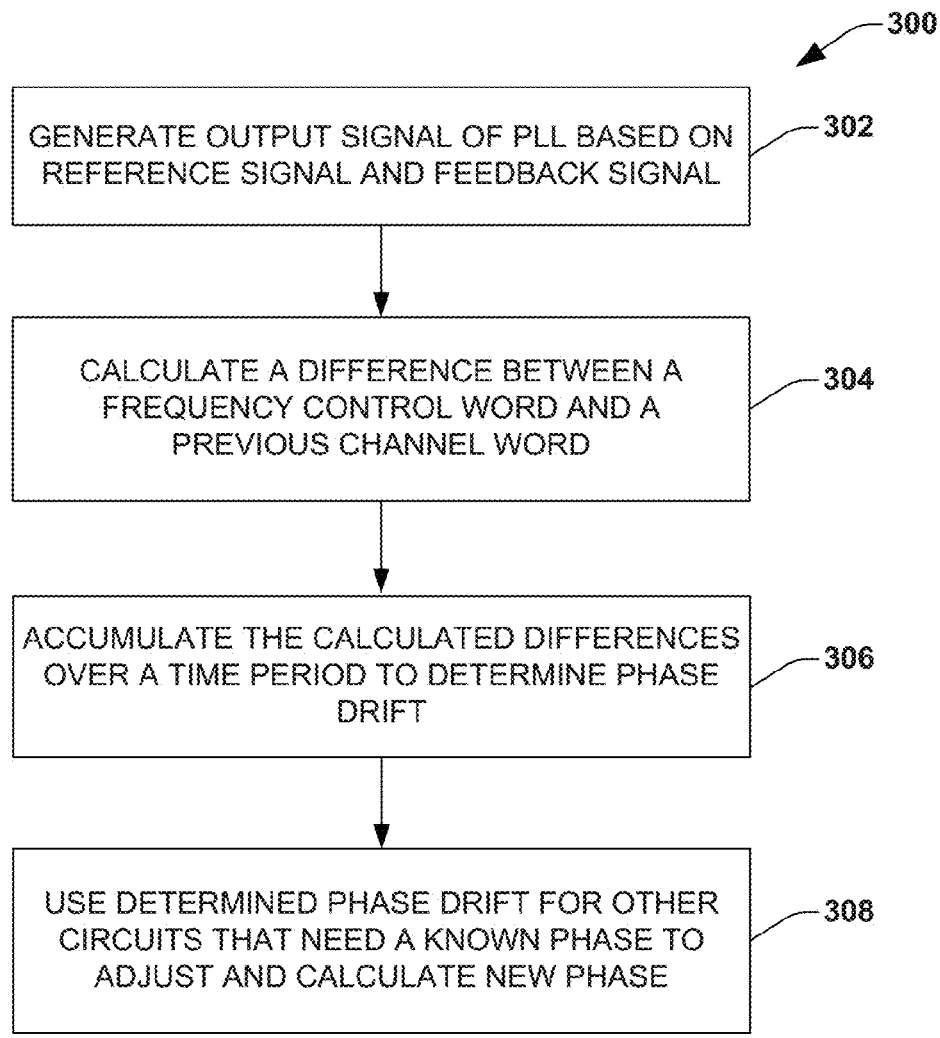
FIG. 11 is a flow chart illustrating a method of operating a phase locked loop that tracks a phase drift in an output frequency thereof according to another embodiment of the disclosure.

According to another embodiment, a method of operating a phase locked loop is illustrated in FIG. 11 at reference numeral 300. The method 300 includes generating an output oscillator signal of a phase locked loop based on a reference signal having a reference frequency and a feedback signal having a feedback frequency at 302. A difference between a frequency control word that dictates a new divider value in the feedback path of the phase locked loop and a previous control word is calculated at 304. In one embodiment the frequency control word is a combination of modulation data and a new channel word.

In one embodiment, the calculated difference contains information related to a difference between the previous and new channel frequencies associated with an interruption of the circuit. The calculated differences between the frequency control word and the previous channel word are then accumulated over a period of time associated with the new channel frequency at 306. The accumulated differences correspond to an amount of phase drift of the output signal of the phase locked loop. The method 300 then continues at 308, wherein the determined phase drift of the output signal of the phase locked loop is employed by other circuits that employ knowledge of the output signal phase. One example of such a circuit is a spur cancellation circuit.

In another embodiment of the disclosure, a method of operating a phase locked loop is provided. While the method provided herein is illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

In one example a phase locked loop comprises a phase locked loop circuit configured to output an output signal based on a reference frequency and a current channel word, and a phase tracking circuit. The phase tracking circuit is configured to determine a phase drift of the output signal based on a previous channel word and the current channel word of the phase locked loop circuit.

In one example of the phase locked loop, the phase tracking circuit comprises an accumulator circuit that accumulates a difference between an input sequence and the previous channel word. In one embodiment, the input sequence includes the current channel word and modulation data, and the accumulated difference represents the phase drift.

In one example of the phase locked loop circuit, the phase tracking circuit comprises a first calculation circuit configured to calculate a frequency control word based on the current channel word and modulation data, and a second calculation circuit configured to determine a difference between the frequency control word and the previous channel word. In one embodiment, the difference represents a slope of the phase drift in the output signal. The phase tracking circuit further comprises an accumulator circuit configured to accumulate the difference representing the slope over a time period associated with an interruption of the output frequency. In one embodiment, the accumulated difference over the time period represents the phase drift of the output signal due to the interruption.

In one example of the phase locked loop, the phase locked loop circuit comprises a feedforward path configured to receive a reference signal and a feedback signal, and output the output signal based thereon. The phase locked loop further comprises a feedback path comprising a divider circuit that receives the output signal and outputs the feedback signal based on a divider control signal that is a function of modulation data.

In one example of the phase locked loop, the circuit comprises a feedforward path receiving a reference signal having a reference frequency and outputting an output signal having an output frequency that is a function of the reference signal and a feedback signal. The circuit further comprises a feedback path having a divider circuit associated therewith that is configured to receive the output signal and generate the feedback signal having a reduced frequency based on a divide value of the divider circuit. The feedback signal is supplied to the feedforward path. The circuit further comprises a modulator circuit configured to receive modulation data and provide a divider control signal to the divider circuit to control the divide value thereof, and a phase tracker circuit. The phase tracker circuit is configured to determine an amount of phase drift from an initial phase value of the output signal due to an interruption in a locked state of the phase locked loop.

In one example of the phase locked loop, the phase tracker circuit is configured to determine the amount of phase drift from the initial phase value of the output signal due to an interruption using a modulation input sequence and a previous channel word.

In one example of the phase locked loop, the modulation input sequence comprises modulation data and a new channel word that determines a new channel frequency of the phase locked loop.

In one example of the phase locked loop, the phase tracker circuit comprises a first computation circuit configured to combine modulation data with a new channel control word to form a frequency control word for use by the modulator circuit, and a second computation circuit configured to determine a difference between the frequency control word and the previous channel word. In one embodiment, the difference reflects a rate of change of phase drift.

In one example of the phase locked loop, the phase tracker circuit further comprises an accumulator circuit configured to accumulate the difference output from the second computation circuit over a period of time, wherein an accumulated output of the differences from the second computation circuit represents an amount of phase drift from the initial phase value.

In one example of the phase locked loop, the modulator circuit is configured to receive the frequency control word and generate the divider control signal in response thereto.

In one example of the phase locked loop, the feedforward path comprises a time-to-digital converter (TDC) configured to receive the reference signal and the feedback signal, and output an error signal representing a difference in phase between the reference signal and the feedback signal.

In one example of the phase locked loop, the feedforward path further comprises a loop filter configured to receive the error signal and generate an oscillator control signal based thereon, and a controllable oscillator configured to receive the oscillator control signal and generate the output signal having an adjusted output frequency based thereon. The oscillator control signal is configured to minimize an amount of error in the error signal.

In one example of the phase locked loop, the feedforward path further comprises an adder circuit between the loop filter and the controllable oscillator. In one embodiment, the adder circuit is configured to combine the oscillator control signal and further modulation data to form a modulated oscillator control signal for control of the controllable oscillator.

In one example, a method of operating a phase locked loop comprises generating an output signal of the phase locked loop, wherein the output signal has a known phase. The method further comprises tracking a phase drift of the output signal of the phase locked loop from the known phase due to an interruption of the phase locked loop.

In one example of the method, the interruption comprises a change in a channel frequency of the output signal or a phase modulation of the output signal.

In one example of the method, tracking the phase drift of the output signal comprises determining an amount of the phase drift based on a modulation input sequence and a previous channel word of the phase locked loop.

In one example of the method, the modulation input sequence comprises modulation data and a new channel word that dictates a new channel frequency of the phase locked loop.

In one example of the method, tracking the phase drift comprises combining modulation data with a new channel word to form a frequency control word, and determining a difference between the frequency control word and a previous channel word. In one embodiment, the difference reflects a rate of change of phase drift.

In one example of the method, tracking the phase drift further comprise accumulating the difference over a period of time, wherein the accumulated differences represent an amount of phase drift from the known phase.

In one example of the disclosure, a phase locked loop is disclosed, and comprises a feedforward path receiving a reference signal having a reference frequency and outputting an output signal having an output frequency that is a function of the reference signal and a feedback signal. The phase locked loop also comprises a feedback path having a divider circuit associated therewith, and configured to receive the output signal and generate the feedback signal having a reduced frequency based on a divide value of the divider circuit, wherein the feedback signal is supplied to the feedforward path. Further, the phase locked loop comprises a modulator circuit configured to receive modulation data and provide a divider control signal to the divider circuit to control the divide value thereof, and a means for phase tracking to determine an amount of phase drift from an initial phase value of the output signal due to an interruption in a locked state of the phase locked loop.

In another example of the phase locked loop, the means for phase tracker circuit determines the amount of phase drift from the initial phase value of the output signal due to an interruption using a modulation input sequence and a previous channel word.

In another example of the phase locked loop, the modulation input sequence comprises modulation data and a new channel word that determines a new channel frequency of the phase locked loop.

In another example of the phase locked loop, the means for phase tracking comprises a first computation means to combine modulation data with a new channel control word to form a frequency control word for use by the modulator circuit and a second computation means to determine a difference between the frequency control word and the previous channel word, wherein the difference reflects a rate of change of phase drift.

In another example of the phase locked loop, the means for phase tracking further comprises an accumulator means to accumulate the difference output from the second computation means over a period of time, wherein an accumulated output of the differences from the second computation means represents an amount of phase drift from the initial phase value.

In another example of the phase locked loop, the accumulator means further comprises a truncation means to perform a wraparound function at an accumulated phase drift amount greater than 360 degrees.

In another example of the phase locked loop, the truncation means performs the wraparound function by discarding integer portions of the accumulated output of the differences from the second computation circuit.

It should be understood that all the circuits, components, units and other type elements disclosed herein can be employed solely in hardware, solely in software, or in a combination of hardware and software, and all such permutations are contemplated as falling within the scope of the present disclosure.

It should be understood that although various examples are described separately above for purposes of clarity and brevity, various features of the various examples may be combined and all such combinations and permutations of such examples is expressly contemplated as falling within the scope of the present disclosure.

Although the disclosure has been illustrated and described with respect to one or more implementations, alterations and/or modifications may be made to the illustrated examples without departing from the spirit and scope of the appended claims. Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the disclosure may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A phase locked loop, comprising:
a phase locked loop circuit configured to output an output signal based on a reference frequency and a current channel word; and
a phase tracking circuit configured to determine a phase drift amount of the output signal based on a previous channel word and the current channel word of the phase locked loop circuit;
wherein the phase tracking circuit comprises an accumulator circuit that accumulates a difference between an input sequence and the previous channel word,
wherein the input sequence includes the current channel word and modulation data, and
wherein the accumulated difference represents the phase drift amount.

2. The phase locked loop circuit of claim 1, wherein the phase tracking circuit comprises:
a first calculation circuit configured to calculate a frequency control word based on the current channel word and modulation data;
a second calculation circuit configured to determine a difference between the frequency control word and the previous channel word, wherein the difference represents a slope of the phase drift in the output signal; and
an accumulator circuit configured to accumulate the difference representing the slope over a time period associated with an interruption of the output frequency, wherein the accumulated difference over the time period represents the phase drift amount of the output signal due to the interruption.

3. The phase locked loop of claim 1, wherein the phase locked loop circuit comprises:
a feedforward path configured to receive a reference signal and a feedback signal, and output the output signal based thereon; and
a feedback path comprising a divider circuit that receives the output signal and outputs the feedback signal based on a divider control signal that is a function of modulation data.

4. A phase locked loop, comprising:
a feedforward path receiving a reference signal having a reference frequency and outputting an output signal having an output frequency that is a function of the reference signal and a feedback signal;
a feedback path having a divider circuit associated therewith, and configured to receive the output signal and generate the feedback signal having a reduced frequency based on a divide value of the divider circuit, wherein the feedback signal is supplied to the feedforward path;
a modulator circuit configured to receive modulation data and provide a divider control signal to the divider circuit to control the divide value thereof;
a phase tracker circuit configured to determine an amount of phase drift from an initial phase value of the output signal due to an interruption in a locked state of the phase locked loop; and wherein the feedforward path comprises a time-to-digital converter (TDC) configured to receive the reference signal and the feedback signal, and output an error signal representing a difference in phase between the reference signal and the feedback signal.

5. The phase locked loop of claim 4, wherein the phase tracker circuit is configured to determine the amount of phase drift from the initial phase value of the output signal due to an interruption using a modulation input sequence and a previous channel word.

6. The phase locked loop of claim 5, wherein the modulation input sequence comprises modulation data and a new channel word that determines a new channel frequency of the phase locked loop.

7. A phase locked loop, comprising:
    a feedforward path receiving a reference signal having a reference frequency and outputting an output signal having an output frequency that is a function of the reference signal and a feedback signal;;
    a feedback path having a divider circuit associated therewith, and configured to receive the output signal and generate the feedback signal having a reduced frequency based on a divide value of the divider circuit, wherein the feedback signal is supplied to the feedforward path;
    a modulator circuit configured to receive modulation data and provide a divider control signal to the divider circuit to control the divide value thereof; and
    a phase tracker circuit configured to determine an amount of phase drift from an initial phase value of the output signal due to an interruption in a locked state of the phase locked loop,
    wherein the phase tracker circuit is configured to determine the amount of phase drift from the initial phase value of the output signal due to an interruption using a modulation input sequence and a previous channel word, and
    wherein the phase tracker circuit comprises:
        a first computation circuit configured to combine modulation data with a new channel control word to form a frequency control word for use by the modulator circuit; and
        a second computation circuit configured to determine a difference between the frequency control word and the previous channel word, wherein the difference reflects a rate of change of phase drift.

8. The phase locked loop of claim 7, wherein the phase tracker circuit further comprises an accumulator circuit configured to accumulate the difference output from the second computation circuit over a period of time, wherein an accumulated output of the differences from the second computation circuit represents an amount of phase drift from the initial phase value.

9. The phase locked loop of claim 8, wherein the accumulator circuit further comprises a truncation circuit configured to perform a wraparound function at an accumulated phase drift amount greater than 360 degrees.

10. The phase locked loop of claim 9, wherein the truncation circuit is configured to perform the wraparound function by discarding integer portions of the accumulated output of the differences from the second computation circuit.

11. The phase locked loop of claim 7, wherein the modulator circuit is configured to receive the frequency control word and generate the divider control signal in response thereto.

12. The phase locked loop of claim 4, wherein the feedforward path further comprises:
    a loop filter configured to receive the error signal and generate an oscillator control signal based thereon; and
    a controllable oscillator configured to receive the oscillator control signal and generate the output signal having an adjusted output frequency based thereon,
    wherein the oscillator control signal is configured to minimize an amount of error in the error signal.

13. The phase locked loop of claim 12, wherein the feedforward path further comprises:
    an adder circuit between the loop filter and the controllable oscillator, wherein the adder circuit is configured to combine the oscillator control signal and further modulation data to form a modulated oscillator control signal for control of the controllable oscillator.

14. A method of operating a phase locked loop, comprising:
    generating an output signal of the phase locked loop, the output signal having a known phase value; and
    tracking a phase drift of the output signal of the phase locked loop from the known phase value due to an interruption of the phase locked loop,
    wherein tracking the phase drift of the output signal comprises determining an amount of the phase drift based on a modulation input sequence and a previous channel word of the phase locked loop; and
    wherein the modulation input sequence comprises modulation data and a new channel word that dictates a new channel frequency of the phase locked loop.

15. The method of claim 14, wherein the interruption comprises a change in a channel frequency of the output signal or a phase modulation of the output signal.

16. The method of claim 14, wherein tracking the phase drift comprises:
    combining modulation data with a new channel word to form a frequency control word; and
    determining a difference amount between the frequency control word and a previous channel word, wherein the difference amount reflects a rate of change of phase drift.

17. The method of claim 16, wherein tracking the phase drift further comprise accumulating the difference amount over a period of time, wherein the accumulated difference amounts represent an amount of phase drift from the known phase.

\* \* \* \* \*